United States Patent [19]

Asai et al.

[11] Patent Number: 5,012,115
[45] Date of Patent: Apr. 30, 1991

[54] DEVICE FOR OPTICALLY DETECTING HOLD POSITION OF ELECTRONIC COMPONENT WITH DUAL EMITTERS

[75] Inventors: Koichi Asai, Nagoya; Mamoru Tsuda, Okazaki; Yasuo Muto, Chiryu; Sinsuke Suhara, Kariya; Tousuke Kawada, Chiryu, all of Japan

[73] Assignee: Fuji Machine Mfg. Co., Ltd., Aichi, Japan

[21] Appl. No.: 480,592

[22] Filed: Feb. 15, 1990

[30] Foreign Application Priority Data

Feb. 27, 1989 [JP]  Japan .................................. 1-46255

[51] Int. Cl.⁵ .............................................. G01N 21/86
[52] U.S. Cl. .................................. 250/561; 250/461.1
[58] Field of Search .................. 250/561, 461.1, 458.1; 901/47

[56] References Cited

U.S. PATENT DOCUMENTS

| | | | |
|---|---|---|---|
| 3,736,428 | 5/1973 | Monroe | 250/461.1 |
| 3,956,630 | 5/1976 | Mellows | 250/461.1 |
| 4,494,139 | 1/1985 | Shima et al. | 358/101 |
| 4,615,093 | 10/1986 | Tews et al. | 29/407 |
| 4,628,464 | 12/1986 | McConnell | 364/513 |
| 4,747,198 | 5/1988 | Asai et al. | 29/407 |
| 4,800,282 | 1/1989 | Nishimura | 250/461.1 |

Primary Examiner—David C. Nelms
Assistant Examiner—Que Tan Le
Attorney, Agent, or Firm—Oliff & Berridge

[57] ABSTRACT

A detecting device for detecting a position of an electronic component in which the component is held by a holder is disclosed. The detecting device includes a first light emitter for emitting a first radiation toward a vicinity of the electronic component, a second light emitter disposed in the vicinity of the holder, for absorbing the first radiation, and emitting a second radiation having a wavelength different from that of the first radiation, toward the electronic component, and a photoelectric device disposed on one of opposite sides of the electronic component which is remote from the second light emitter. The photoelectric means is insensitive to the first radiation and receives a projection image of the electronic component formed by the second radiation.

16 Claims, 2 Drawing Sheets

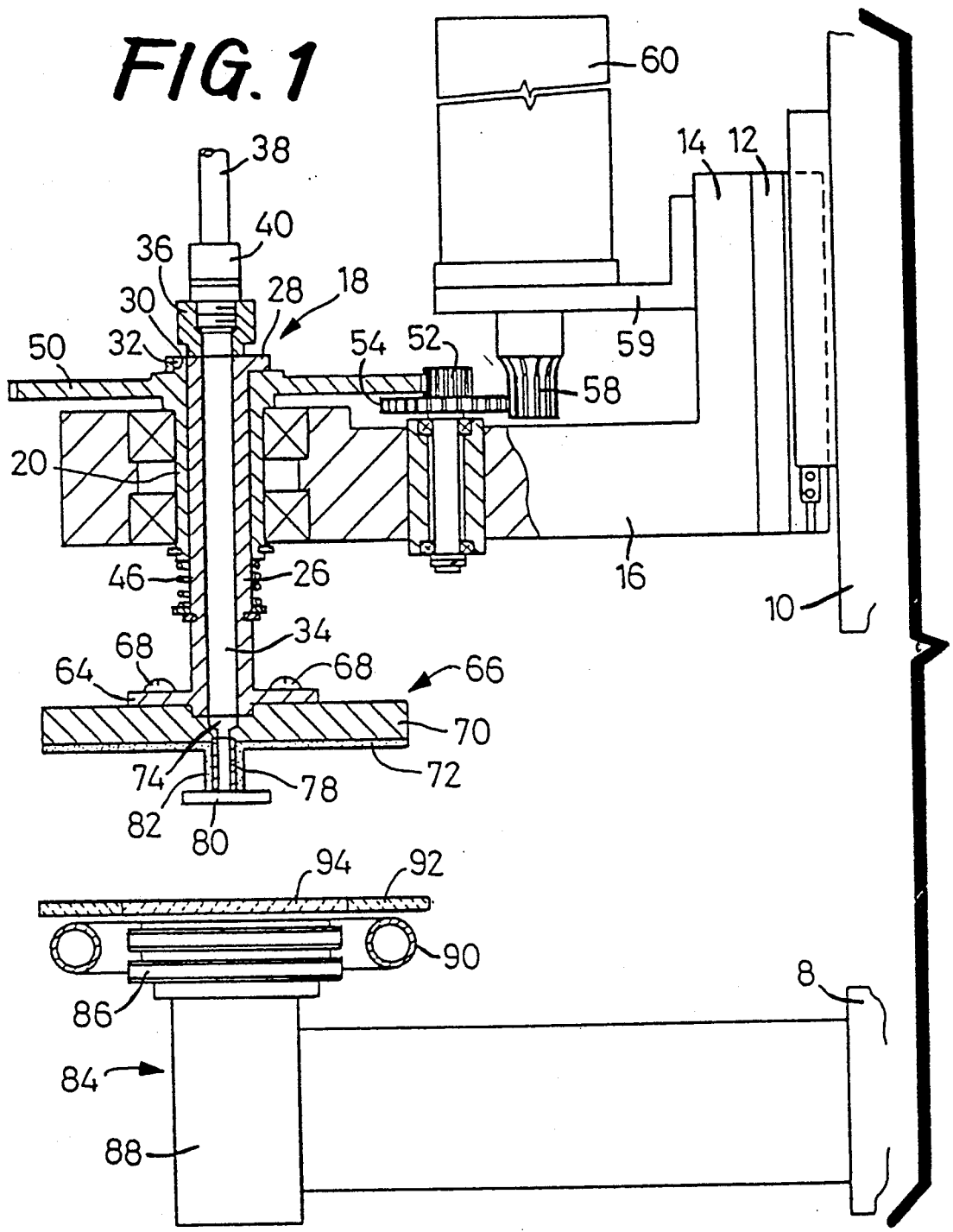

DEVICE FOR OPTICALLY DETECTING HOLD POSITION OF ELECTRONIC COMPONENT WITH DUAL EMITTERS

BACKGROUND OF THE INVENTION

1. Field of the Invention

The present invention relates to a detecting device for detecting the position of an electronic component in which the component is held by a holder, by irradiating the electronic component so as to produce a projection image of the component. More particularly, the present invention is concerned with improvements of the detecting device for simple and accurate detection.

2. Discussion of the Prior Art

The above type of detecting device is known in the art. An example of such a detecting device is disclosed in laid-open Publication No. 60-28298 of unexamined Japanese patent application, in which a light emitter projects light toward a reflecting plate so that the light is reflected by the reflecting plate toward the electronic component, and then received by a charge-coupled device to provide a projection image of the electronic component. In this type of device, the reflecting plate and the charge-coupled device are disposed on the opposite sides of the electronic component, while the light emitter is disposed on the same side as the charge-coupled device to project light toward the reflecting plate. In this arrangement, if the light emitted by the light emitter is directly incident upon and reflected by the electronic component, the reflected light is received by the charge-coupled device, causing adverse influence on the projection image of the electronic component, which results in reduced detecting accuracy of the device. For avoiding this inconvenience, the electronic component is provided with a shielding plate so as to prevent the light emitted by the light emitter from impinging directly on the component.

However, if the electronic component to be held by the device is changed in size, the shielding plate for shielding the electronic component must be replaced by another, in accordance with the size of the component. In this respect, it is to be noted that when the electronic component is exposed to the light reflected by the reflecting plate to provide the projection image thereof, the shielding plate is required to prevent direct exposure of the electronic component to the light emitted from the light emitter, and also to allow the light to impinge on a portion of the reflecting plate which is sufficiently close to the component holder, so that the reflecting plate can reflect the light at that portion which lies within the outline of the electronic component, as well as the surrounding portion outside the periphery of the component. This requirement increases as the size of the electronic component becomes smaller. When the shielding plate appropriate for relatively large electronic components is used for shielding a relatively small component, only the outer portion of the reflecting plate remote from the component holder is irradiated by the light from the light emitter, resulting in an insufficient amount of light reflected by the reflecting plate. On the other hand, when the shielding plate appropriate for relatively small electronic components is used for shielding a relatively large component, the shielding plate cannot sufficiently prevent direct exposure of the electronic component to the light emitted from the light emitter. For these reasons, it is necessary to provide a shielding plate which is suited for each size of the electronic component, resulting in an increased cost of the detecting device, which may require many kinds of shielding plates. Further, a cumbersome procedure is necessary to change the shielding plate each time the size of the electronic component is changed.

SUMMARY OF THE INVENTION

It is therefore an object of the present invention to provide a detecting device which is capable of detecting a hold position of an electronic component with improved reliability, irrespective of a change in the size of the electronic component.

The above object may be accomplished according to the principle of the present invention, which provides a detecting device for detecting a position of an electronic component in which the component is held by a holder, which detecting device comprises: a first light emitter for emitting a first radiation toward a vicinity of the electronic component; a second light emitter disposed in the vicinity of the holder, for absorbing the first radiation, and emitting a second radiation having a wavelength different from that of the first radiation, toward the electronic component; and photoelectric means disposed on one of opposite sides of the electronic component which is remote from the second light emitter, the photoelectric means being insensitive to the first radiation and receiving a projection image of the electronic component formed by the second radiation.

The first and second radiation indicated above should be interpreted to mean not only visible light, but also any other kind of light, such as infrared rays, ultraviolet rays, X rays and $\gamma$ rays. For example, the first radiation consists of an ultraviolet radiation while the second radiation consists of a visible radiation. Alternatively, the first and second radiations consist of visible radiations having different wavelengths, respectively.

In the detecting device constructed as described above, the photoelectric means is adapted to produce a projection image of the electronic component based on the second radiation emitted by the second light emitter. Since this photoelectric means is insensitive to the first radiation emitted by the first light emitter, the projection image is not affected by the first radiation, even if the photoelectric means is exposed to the first radiation reflected by the electronic component or the surrounding parts of the holding device, or even if the first radiation directly reaches the photoelectric means. Thus, a clear, high-contrast projection image of the electronic component can be obtained.

As described above, the detecting device according to the present invention does not require provision or replacement of conventionally used shielding plates for shielding the electronic component, since the first radiation from the first light emitter has no influence on the projection image of the electronic component. Thus, the present detecting device is capable of easily and accurately detecting the hold position of the electronic component, in which the component is held by the holder.

BRIEF DESCRIPTION OF THE DRAWINGS

The foregoing and optional objects, features and advantages of the present invention will be better understood by reading the following detailed description of presently preferred embodiments, when considered in connection with the accompanying drawings in which:

FIG. 1 is a front elevational view partially in cross section, showing a holding device for holding an electronic component, which includes one embodiment of the detecting device according to the present invention;

FIG. 2 is a front elevational view in cross section, showing another form of a second light emitter used in the detecting device of FIG. 1.

DETAILED DESCRIPTION OF THE PREFERRED EMBODIMENTS

Figure 3:
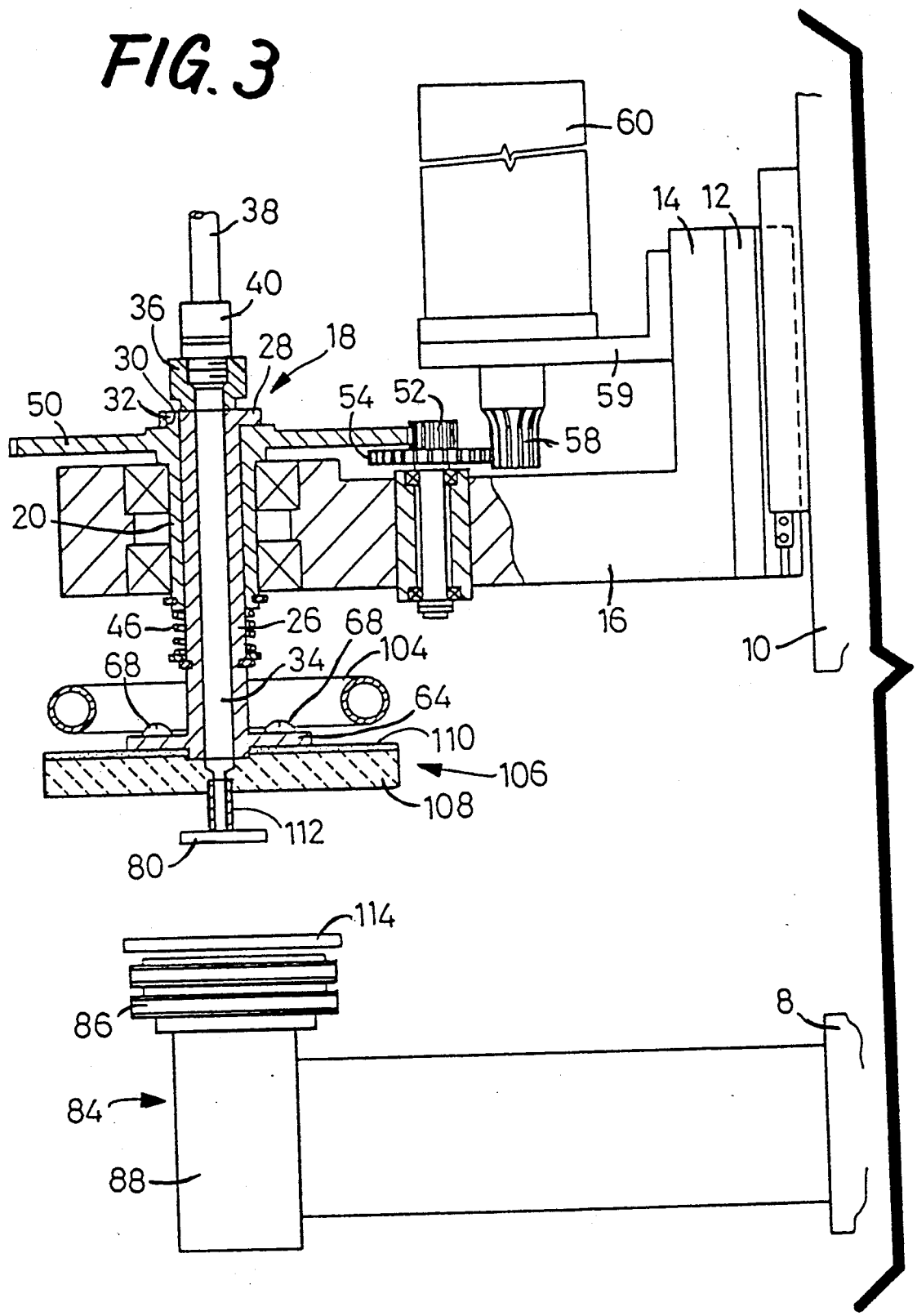
FIG. 3 is a front elevational view in partially cross section, showing an electric component holding device, which includes another embodiment of the detecting device according to the present invention.

Referring first to FIG. 1, there is illustrated a holding device for holding an electronic component to place the same on a printed-wiring board. In FIG. 1, reference numeral 8 designates a frame, to which an X-Y table 10 is attached such that the X-Y table 10 is movable in the horizontal plane, in the X and Y directions which intersect each other at right angles. The X-Y table 10 is driven by a servomotor or other driving system, so that the table 10 is positioned at a intended position in the horizontal plane with high accuracy. Further, the X-Y table 10 is provided with a linear slide 12 which is moved in the vertical direction by a driving system (not shown). To the linear slide 12, there is fixed a holder 14 which has an arm portion 16 extending from its lower end portion in the horizontal direction. An cylindrical member 18 is supported by the arm portion 16 of the holder 14 through a sleeve 20, such that the cylindrical member 18 is rotatable about its vertical axis perpendicular to the direction of extension of the arm portion 16.

The cylindrical member 18 takes a stepped configuration, that is, consists of a small-diameter portion 26 and a large-diameter portion 28. The small-diameter portion 26 of the cylindrical member 18 engages the inner surface of the sleeve 20 such that the cylindrical member 18 is axially slidably movable relative to the sleeve 20. At the same time, the cylindrical member 18 is prevented from rotating relative to the sleeve 20, due to engagement between an engaging hole 30 formed in the large-diameter portion 28, and an engaging protrusion 32 provided on the upper end face of the sleeve 20. Further, the cylindrical member 18 has an air passage 34 formed through its radially central portion over the entire axial length thereof, and a nut 36 is fixed to the upper end face of the cylindrical member 18. A connector 40 is threaded to the nut 36 for connection with a vacuum rubber hose 38, so that the cylindrical member 18 is connected to a vacuum source (not shown), through the nut 36, connector 40 and vacuum hose 38. Between the sleeve 20 and a lower portion of the cylindrical member 18 which protrudes from the sleeve 20, there is provided a compression coil spring 46 to hold the large-diameter portion 28 of the cylindrical member 18 in abutting contact with the upper end face of the sleeve 20.

The holding device further includes a large-diameter gear 50 which is formed as a part of the sleeve 20 at its upper end portion which protrudes upwardly from the arm portion 16, and a small-diameter gear 52 which is rotatably supported by the arm portion 16 and meshing with the large-diameter gear 50. The small-diameter gear 52 is fixed to an intermediate gear 54, which meshes with a drive gear 58. In operation, the drive gear 58 is rotated by a servomotor 60, which is attached to the linear slide 12 by means of a bracket 59. As a result, the large-diameter gear 50 integral with the sleeve 20 is rotated by the drive gear 58, through the intermediate gear 54 and small-diameter gear 52, and consequently, the sleeve 20 is rotated with the cylindrical member 18.

The cylindrical member 18 has an outward flange 64 formed at its lower end portion which protrudes downwardly from the sleeve 20. To the lower surface of the outward flange 64 is secured a light-emitting plate 66 by means of screws 68. The light-emitting plate 66 includes a body 70 fixed to the outward flange 64, and a light-emitting layer 72 which is formed by coating the lower surface of the body 70 with a fluorescent paint. The light-emitting plate 66 has an air passage 74 formed therethrough in the direction of thickness thereof, such that the air passage 74 is concentric with the air passage 34 formed through the cylindrical member 18. The air passage 74 is open at its one end in the central portion of the surface of the light-emitting layer 72, and is connected at the other end to the vacuum source through the air passage 34. The holding device further has a highly wear-resistant suction tube 78 made of metal, which is press-fitted in the one end of the air passage 74 which is open in the surface of the light-emitting layer 72. The suction tube 78 has a cross-sectional area which is smaller than that of an electronic component 80 to be held by the holding device. The suction tube 78 has an outer circumferential surface which is coated with a fluorescent paint, to thereby form a light-emitting layer 82 which extends from the light-emitting layer 72 formed on the body 70 of the light-emitting plate 66. In operation, the suction tube 78 is adapted to suck or release the electronic component 80, according to switching operation of an electromagnetic directional control valve of the vacuum source.

The light-emitting plate 66 serves as part of a detecting device for detecting the position of the electronic component 80 which is retained under suction of the air by the suction tube 78. The detecting device further includes photoelectric means in the form of a charge-coupled device (CCD) 84 attached to the frame 8. The charge-coupled device 84 has a lens 86 and a camera 88, and is disposed so as to face the light-emitting plate 66, such that the electronic component 80 held by the suction tube 78 is interposed between the charge-coupled device 84 and the plate 66, when the suction tube 78 is positioned right above the charge-coupled device 84. Around the lens 86 of the charge-coupled device 84, there is disposed a first light emitter in the form of a ring lamp 90, which is attached to the frame 8 through a bracket (not shown). The ring lamp 90 is adapted to generate a first radiation which is ultraviolet light. On one of the opposite sides of the ring lamp 90 which faces the light-emitting plate 66, there is disposed an annular first filter 92 which is supported by the bracket indicated above, to permit only ultraviolet light to be transmitted therethrough. In this arrangement, the light-emitting plate 66 is exposed to only the ultraviolet light which is generated by the ring lamp 90 and transmitted through the first filter 92. The light-emitting layers 72, 82 of the plate 66, which are formed of the fluorescent paint, are capable of absorbing incident ultraviolet light and emitting visible light upon exposure to the ultraviolet light. Namely, the wavelength of the incident light to which the light-emitting plate 66 is exposed is different from that of the light which is emitted by the light-emitting plate 66. The charge-coupled device 84 further includes a second filter 94, which is supported by the bracket supporting the first filter 92, and is disposed inside the filter 92 and adjacent the lens 86, so as to face the electronic component 80. This second filter 94 is adapted to absorb ultraviolet light and permit visible light to be transmitted therethrough. Thus, the charge-coupled device 84 receives only the visible light which is emitted by the light-emitting layers 72, 82.

The holding device constructed as described above is operated to pick up the electronic component 80 from a well known component supply device, and place the component 80 on a printed-wiring board. The charge-coupled device 84 is disposed between the position in which the holding device picks up the electronic component 80, and the position in which the electronic component 80 is placed on the printed-wiring board, so that the position of the electronic component 80 at which it is held by the holding device is detected by the charge-coupled device 84. The electronic component 80 is placed on the printed-wiring board only after any error in the hold-position of the component 80 has been corrected in the manner as described later.

When the holding device picks up the electronic component 80 from the supply device, the suction tube 78 is positioned right above the electronic component 80 to be mounted on the printed-wiring board, and then the linear slide 12 is lowered to bring the suction tube 78 into abutment with the upper surface of the electronic component 80. Although the linear slide 12 is slightly lowered after the suction tube 78 abuts on the component 80, the electronic component 80 and suction tube 78 are protected against damage, since the suction tube 78 can be moved in its upward direction relative to the sleeve 20, due to compression of the compression coil spring 46. In this condition, the suction tube 78 is brought into communication with the vacuum source, so as to suck the electronic component 80.

Subsequently, the linear slide 12 is lifted up, and the X-Y table 10 is moved in the horizontal plane to bring the suction tube 78 into a position just above the charge-coupled device 84. Then, the ring lamp 90 generates light, of which only the ultraviolet light is transmitted through the first filter 92 to irradiate the light-emitting plate 66. As a result, the light-emitting layers 72, 82 of the light-emitting plate 66 absorb the ultraviolet light and project visible light toward the electronic component 80, so that the visible light passes through the lens 86 to thereby produce a projection image of the electronic component 80 on a solid charge-coupled element of the charge-coupled device 84. In this case, the ultraviolet light emitted by the ring lamp 90 also irradiates the electronic component 80 and the surrounding parts of the holding device, and some rays of the light reflected by the component 80 and parts of the holding device are directed toward the charge-coupled device 84. Nonetheless, since the second filter 94 is provided for absorbing the ultraviolet light, the charge-coupled device 84 can produce a clear projection image of the electronic component 80 by the visible light emitted by the light-emitting plate 66, without being affected by the ultraviolet light of the ring lamp 90 reflected by the electronic component 80 and the surrounding components of the device. Thereafter, the charge-coupled device 84 converts the projection image into binary coded signals, which are applied to a suitable control device. The control device compares the received binary coded signals with reference position signals representing the nominal position of the electronic component 80, which reference position signals are stored in a memory of the control device, in order to calculate an angular or rotational error $\Delta\theta$ of the electronic component 80 from the nominal position about its center (i.e., about the center line of the suction pipe 78), and errors $\Delta X$ and $\Delta Y$ by which the center of the component 80 deviates from the nominal position in the X and Y directions, respectively.

After the position of the electronic component 80 is detected by the charge-coupled device 84, the component 80 is moved into the position in which the component 80 is mounted on the printed-wiring board. Prior to the mounting of the component 80, the X-Y position errors $\Delta X$ and $\Delta Y$ are corrected by adjusting the distances of the horizontal movements of the X-Y table 10, and the rotational error $\Delta\theta$ is corrected by driving the servomotor 60 to rotate the suction tube 78 by a suitable angle. Accordingly, when the suction tube 78 is located in the position in which the electronic component 80 is placed on the printed-wiring board, the component 80 and the printed-wiring board are held in a proper positional relationship with each other, permitting the component 80 to be properly mounted on the board. In this condition, the linear slide 12 is lowered, and the electronic component 80 held by the suction tube 78 is pushed against the printed-wiring board, and is fixed at the predetermined position by bonding, for example. At the same time, the suction tube 78 is brought into communication with the atmosphere by switching operation of the electromagnetic directional control valve indicated above, whereby the electronic component 80 is released from the suction tube 78. Thus, the mounting of the component 80 on the printed-wiring board is accomplished when the suction tube 78 is lifted away from the board.

In the holding device of the present embodiment, the position of the electronic component 80 held by the suction tube 78 is detected based on the light emitted by the ring lamp 90 which is disposed on the side of the charge-coupled device 84. Since the second filter 94 serves to intercept the light which has been emitted by the ring lamp 90 and reflected by the holding device, the charge-coupled device 84 is prevented from receiving the reflected light generated by the ring lamp 90. Therefore, the present detecting device is able to detect the hold-position of the electronic component 80 with ease and high accuracy, so as to obtain a clear projection image of the component 80, without requiring a shielding plate for shielding the electronic component 80 from the light of the ring lamp 90.

In the present embodiment, since the outer circumferential surface of the suction tube 78 as well as the surface of the light-emitting plate 66 is coated with the fluorescent paint, to form the light-emitting layer 72, 82 for emitting visible light, the detecting device can provide a clear projection image of the electronic component 80 even if the size of the component 80 is very small.

Further, the light-emitting plate 66 is adapted to emit the visible light in response to the incident ultraviolet light which has been emitted by the ring lamp 90 for irradiating the fluorescent paint of the light-emitting layers 72, 82. Therefore, unlike a light-emitting element or device which generates light with an electrical supply from a power source, the light-emitting plate 66 of the present detecting device does not need an electric cable or other power connection components for electrical connection between the plate 66 and the power source. Namely, no special provisions are necessary to avoid twisting of the electric cable when the plate 66 is lifted or rotated together with the cylindrical member 18. Thus, the present detecting device can be simplified in construction.

Moreover, the component detecting device of the present invention is available at a relatively low cost, as compared with the conventional counterpart using a light-emitting device having multiplicity of light-emitting elements.

While the light-emitting plate 66 consists of the body 70 and light-emitting layer 72 in the illustrated embodiment of FIG. 1, the light-emitting plate 66 may be replaced by a light-emitting plate 100 formed of a synthetic resin such as acrylic resin or polyacetal resin (e.g., Duracon available from Poly Plastic Co. and Delrin available from Du Pont Co.), which contains a fluorescent paint. An example of the material for the light-emitting plate 100 is "Clear Color" available from Takiron.

In the illustrated embodiments of FIGS. 1 and 2, the ring lamp 90 is disposed around the charge-coupled device 84 such that the lamp 90 is located on the side of the electrical component 80 remote from the light-emitting plate 66, 100. However, it is possible to provide a ring lamp 104 on the other side of the electrical component 80 remote from the charge-coupled device 84, as shown in FIG. 3, so that the ring lamp 104 projects light downward to irradiate the upper surface of a light-emitting plate 106. The ring lamp 104, which is of the same type as the ring lamp 90 indicated above, is disposed around the cylindrical member 18 while being supported by a bracket (not shown). The light-emitting plate 106 employed in this modified embodiment consists of a body 108 fixed to the outward flange 64 of the cylindrical member 18, and a light-emitting layer 110 which is formed on the upper surface of the body 108 facing the ring lamp 104 and which consists of a fluorescent paint. The body 108 of the light-emitting plate 106 is made of a translucent material having a property of diffusing light. In this embodiment, a suction tube 112 is secured to the bottom surface of the body 108 which faces the charge-coupled device 84. As in the preceding embodiments, the charge-coupled device 84 has a filter 114 which is capable of absorbing ultraviolet light and permitting transmission of light whose wavelength is different from that of the ultraviolet light.

In this modified embodiment, the light-emitting layer 110 functions to absorb the ultraviolet light emitted by the ring lamp 104, and generate visible light. The visible light emitted by the layer 110 is transmitted through the translucent body 108 while being diffused, to consequently irradiate the electronic component 80, so that the visible light is received by the charge-coupled device 84 to form a projection image of the component 80. Thus, the position of the electrical component 80 held by the suction tube 78 is detected. Since the ring lamp 104 is disposed on the side of the light-emitting plate 106 remote from the charge-coupled device 84, most of the ultraviolet light emitted by the ring lamp 104 is absorbed by the light-emitting layer 110, without the ultraviolet light affecting the projection image of the electronic component 80. In some cases, however, the ultraviolet light generated by the ring lamp 104 is directed to the charge-coupled device 84. For example, a portion of the ultraviolet light of the ring lamp 104 impinges on the surrounding parts of the device, and is reflected by those parts toward the charge-coupled device 84. When the light-emitting plate 106 is replaced by another one having a smaller size, in accordance with reduction in the size of the electrical component 80, a portion of the light of the ring lamp 104 reaches the charge-coupled device 84 beyond the light-emitting plate 106. In these cases, however, the most part of the ultraviolet light is absorbed by the filter 114 provided on the charge-coupled device 84, and therefore, the projection image of the electronic component 80 is less likely to be affected by the light of the ring lamp 104, assuring improved sensing accuracy of the present detecting device.

While the translucent body 108 is used for the light-emitting plate 106 in the modified embodiment, the body 108 may be made of a transparent material.

It is also possible in this embodiment to provide a filter for absorbing the visible light which is generated by the ring lamp 104 together with the ultraviolet light.

While the first light emitter is disposed above or below the electronic component 80 in the illustrated embodiments, it may be disposed so as to face the side surface of the electronic component 80, or may be disposed above or below and to the right or left of the electronic component 80, so that the first light emitter projects light in a direction different from those (upward and downward directions) in the illustrated embodiments. In this case, a suitable filter is provided for removing the light having the same wavelength as that of the light emitted by the second light-emitting body, if the light of the first light emitter may be incident upon irradiate the charge-coupled device or the electronic component.

While the first light emitter is adapted to generate ultraviolet light while the second light emitter generate visible light in the illustrated embodiments, these first and second light emitters may respectively generate different wavelengths of light other than the ultraviolet and visible rays. In this case, the detecting device is provided with a filter or filters as needed, which are suited for the wavelengths of the light emitted by the first and second light emitters. For example, the first light emitter may generate infrared light while the second light emitter absorbs infrared light and generates visible light. It is also possible that the first and second light emitters generate respective visible lights having different wavelengths.

Further, the provision of the filters for the first light emitter and charge-coupled device is not essential to the principle of the present invention. Rather, the filter for the first light emitter may be eliminated if the first light emitter is capable of generating only a specific wavelength of light. The filter for the charge-coupled device may be eliminated if the charge-coupled device is not sensitive to the light emitted by the first light emitter, but sensitive only to the light emitted by the second light emitter.

While the second light emitter takes the form of a plate in the illustrated embodiments, it may take a tapered tubular shape or any other suitable shape. It is also possible to dispose the second light emitter in an inclined posture, if the electronic component is held by the holding device while the cylindrical member 18 is moved in a direction other than the vertical direction thereof. In either case, the first light emitter may take any suitable form other than the ring lamp, provided the first light emitter is oriented to generate light toward the second light emitter. According to the present invention, since the lights emitted by the first and second light emitters have different wavelengths, the projection image of the electrical component does not suffer from any adverse influence caused by the light of the first light emitter. Accordingly, the first light emitter is located in any position which enables the second light emitter to uniformly and efficiently irradiate the electronic component. In the case where the present invention is applied to a detecting device incorporated in a holding device having a plurality of suction tubes for holding the corresponding number of electronic components, the first light emitter can be located anywhere provided that all the electronic components held by the suction tubes ar uniformly irradiated by the light of the second light emitter, so as to obtain a high contrast projection image of the electronic components.

While the light-emitting plate 66, 100, 106 is adapted to hold or support the suction tube 78, 112 in the illustrated embodiments so that the electronic component 80 is irradiated by the light-emitting plate positioned considerably close to the component 80, the light-emitting plate may be affixed to the arm portion 16 or any other suitable component other than the suction tube 78, 112.

It is to be understood that the present invention is by no means limited to the details of the illustrated embodiments, but may be embodied with various other changes, modifications and improvements which may occur to those skilled in the art, without departing from the scope and spirit of the present invention as defined in the appended claims.

What is claimed is:

1. A detecting device for detecting a position of an electronic component in which the component is held by a holder, comprising:
   a first light emitter for emitting a first radiation toward a vicinity of said electronic component;
   a second light emitter disposed in the vicinity of said holder, for absorbing said first radiation, and emitting a second radiation having a wavelength different from that of said first radiation, toward said electronic component; and
   photoelectric means disposed on one of opposite sides of said electronic component which is remote from said second light emitter, said photoelectric means being insensitive to said first radiation and receiving a projection image of said electronic component formed by said second radiation.

2. A detecting device according to claim 1, wherein said first radiation consists of an ultraviolet radiation while said second radiation consists of a visible radiation.

3. A detecting device according to claim 1, wherein said first and second radiations consist of visible radiations having different wavelengths, respectively.

4. A detecting device according to claim 1, wherein said first light emitter comprises a ring lamp which is concentric with said holder and said photoelectric means, at least when said holder and said photoelectric means are placed in a concentric positional relationship with each other.

5. A detecting device according to claim 1, wherein said second light emitter comprises a body and a light-emitting layer which is formed on said body so as to face said electronic component.

6. A detecting device according to claim 5, wherein said light-emitting layer comprises a fluorescent paint.

7. A detecting device according to claim 1, wherein said holder comprises a suction tube having an air suction passage which is open at a free end thereof, and said second light emitter comprises a flange extending radially outwardly from an outer surface of said suction tube, and a light-emitting layer formed on said outer surface of said suction tube and one of opposite surfaces of said flange which is adjacent to said free end of said suction passage.

8. A detecting device according to claim 7, wherein said light-emitting layer comprises a fluorescent paint.

9. A detecting device according to claim 1, wherein said second light emitter comprises a light-emitting layer and a diffusion layer which are superposed on each other, said diffusion layer diffusing said second radiation received from said light-emitting layer, said light-emitting layer facing said first light emitter, while said diffusion layer facing said electronic component held by said holder.

10. A detecting device according to claim 9, wherein said light-emitting layer comprises a fluorescent paint.

11. A detecting device according to claim 1, wherein said second light emitter consists of a translucent member which contains light-emitting particles.

12. A detecting device according to claim 11, wherein said light-emitting particles are fluorescent particles.

13. A detecting device according to claim 1, further comprising a filter disposed between said first and second light emitters said filter permitting said first radiation to transmit therethrough while preventing said second radiation from transmitting therethrough while preventing said first radiation from transmitting therethrough.

14. A detecting device according to claim 1, wherein said holder comprises a suction tube having an air suction passage which is open at a free end thereof, and said second light emitter is disposed around said suction tube.

15. A detecting device according to claim 1, wherein said holder is capable of effecting at least one of a first linear movement parallel to a centerline thereof, a second linear movement perpendicular to said centerline, and a third rotating movement about said centerline.

16. A detecting device according to claim 1, wherein said photosensitive means comprises a photosensitive portion, and a filter disposed between said second light emitter and said photosensitive portion, said filter permitting said second radiation to transmit therethrough while preventing said first radiation from transmitting therethrough.

* * * * *